United States Patent
Kim et al.

(10) Patent No.: US 10,968,510 B2
(45) Date of Patent: *Apr. 6, 2021

(54) SPUTTER TRAP HAVING MULTIMODAL PARTICLE SIZE DISTRIBUTION

(71) Applicant: Honeywell International Inc., Morris Plains, NJ (US)

(72) Inventors: Jaeyeon Kim, Liberty Lake, WA (US); Patrick K. Underwood, Spokane Valley, WA (US); Susan D. Strothers, Mead, WA (US); Michael D. Payton, Rockford, WA (US); Scott R. Sayles, Mead, WA (US)

(73) Assignee: Honeywell International Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/847,612

(22) Filed: Apr. 13, 2020

(65) Prior Publication Data

US 2020/0240004 A1    Jul. 30, 2020

Related U.S. Application Data

(63) Continuation of application No. 15/824,802, filed on Nov. 28, 2017, now Pat. No. 10,655,212.

(Continued)

(51) Int. Cl.
*C23C 14/34* (2006.01)
*H01J 37/34* (2006.01)
(Continued)

(52) U.S. Cl.
CPC .......... *C23C 14/3407* (2013.01); *C23C 4/08* (2013.01); *C23C 14/028* (2013.01); *C23C 24/04* (2013.01);
(Continued)

(58) Field of Classification Search
None
See application file for complete search history.

(56) References Cited

U.S. PATENT DOCUMENTS 5,009,765 A   4/1991   Qamar et al.
5,464,520 A   11/1995  Kano et al.
(Continued)

FOREIGN PATENT DOCUMENTS

CN   101519767 B   7/2011
JP   10-298743 A   11/1998
(Continued)

OTHER PUBLICATIONS

International Search Report and Written Opininion issued in PCT/US2016/054813, dated Jan. 18, 2017, 14 pages.
(Continued)

*Primary Examiner* — Jason Berman
(74) *Attorney, Agent, or Firm* — Faegre Drinker Biddle & Reath LLP

(57) ABSTRACT

A sputter trap formed on at least a portion of a sputtering chamber component has a plurality of particles and a particle size distribution plot with at least two different distributions. A method of forming a sputter trap having a particle size distribution plot with at least two different distributions is also provided.

19 Claims, 5 Drawing Sheets

Related U.S. Application Data

(60) Provisional application No. 62/434,673, filed on Dec. 15, 2016.

(51) Int. Cl.
*C23C 4/08* (2016.01)
*C23C 24/04* (2006.01)
*C23C 14/02* (2006.01)

(52) U.S. Cl.
CPC ...... *H01J 37/3414* (2013.01); *H01J 37/3423* (2013.01); *H01J 37/3426* (2013.01); *H01J 37/3429* (2013.01); *H01J 37/3491* (2013.01)

(56) References Cited

U.S. PATENT DOCUMENTS

| | | | |
|---|---|---|---|
| 5,474,649 A | 12/1995 | Kava et al. | |
| 5,658,442 A | 8/1997 | Van et al. | |
| 5,725,739 A | 3/1998 | Hu | |
| 5,863,393 A | 1/1999 | Hu | |
| 6,083,361 A | 7/2000 | Kobayashi et al. | |
| 6,162,297 A | 12/2000 | Mintz et al. | |
| 6,214,711 B1 | 4/2001 | Hu | |
| 6,217,715 B1 | 4/2001 | Sun et al. | |
| 6,451,176 B1 | 9/2002 | Vernon et al. | |
| 6,461,483 B1 | 10/2002 | Gopalraja et al. | |
| 6,506,312 B1 | 1/2003 | Bottomfield | |
| 6,620,296 B2 | 9/2003 | Gogh et al. | |
| 6,806,573 B2 | 10/2004 | Hu | |
| 6,812,471 B2 | 11/2004 | Popiolkowski et al. | |
| 6,933,508 B2 | 8/2005 | Popiolkowski et al. | |
| 6,955,748 B2 | 10/2005 | Kim | |
| 7,762,114 B2 | 7/2010 | Abney et al. | |
| 10,655,212 B2 * | 5/2020 | Kim .................. | C23C 24/04 |
| 2001/0010405 A1 | 8/2001 | Hu | |
| 2002/0121436 A1 | 9/2002 | Gogh et al. | |
| 2003/0116425 A1 | 6/2003 | Okabe et al. | |
| 2003/0134054 A1 | 7/2003 | Demaray et al. | |
| 2003/0173526 A1 | 9/2003 | Popiolkowski et al. | |
| 2004/0056211 A1 | 3/2004 | Popiolkowski et al. | |
| 2004/0089543 A1 | 5/2004 | Kim | |
| 2004/0206804 A1 | 10/2004 | Kim et al. | |
| 2005/0082258 A1 | 4/2005 | Kim | |
| 2006/0005767 A1 | 1/2006 | Tsai et al. | |
| 2007/0039818 A1 | 2/2007 | Hasegawa | |
| 2007/0056688 A1 | 3/2007 | Kim et al. | |
| 2009/0120462 A1 | 5/2009 | West et al. | |
| 2009/0194414 A1 | 8/2009 | Nolander et al. | |
| 2010/0326816 A1 | 12/2010 | Myli et al. | |
| 2012/0258280 A1 | 10/2012 | Jackson et al. | |
| 2012/0318668 A1 | 12/2012 | Tsukamoto | |
| 2013/0277895 A1 | 10/2013 | Yamazaki et al. | |
| 2014/0251217 A1 | 9/2014 | Nguyen et al. | |
| 2015/0079336 A1 | 3/2015 | Wang et al. | |
| 2017/0229295 A1 | 8/2017 | Kim et al. | |
| 2018/0100231 A1 * | 4/2018 | Shin .................. | B23K 1/002 |
| 2018/0171465 A1 | 6/2018 | Kim et al. | |

FOREIGN PATENT DOCUMENTS

| | | |
|---|---|---|
| KR | 10-2013-0018957 A | 2/2013 |
| WO | 2016/051771 A1 | 4/2016 |
| WO | 2016/146732 A1 | 9/2016 |

OTHER PUBLICATIONS

International Search Report and Written Opinion issued in PCT/US2016/042740, dated Oct. 20, 2016, 13 pages.

International Search Report and Written Opinion received for PCT Patent Application No. PCT/US2017/064475, dated Mar. 16, 2018, 10 pages.

Mitutoyo, "Portable Surface Roughness Tester Surftest SJ-410 Series," Bulletin No. 2196, Aug. 2015, 12 pages.

Mitutoyo, "Suftest SJ-201P Portable Surface Roughness Tester," Bulletin No. 1795, Oct. 2004, 6 pages.

Rawle, Alan. "Basic Principles of Particle Size Analysis."Malvern instruments Limited [online], [retrived at least as early as Dec. 12, 2016]. Retrived from the internet <URL:http://www.rci.rutgers.edu/~moghe/PSD%20Basics.pdf>, 8 pages.

* cited by examiner

SPUTTER TRAP HAVING MULTIMODAL PARTICLE SIZE DISTRIBUTION

CROSS-REFERENCE TO RELATED APPLICATION

This application is a continuation application of U.S. patent application Ser. No. 15/824,802, filed Nov. 28, 2017, which claims priority to Provisional Application No. 62/434,673, filed Dec. 15, 2016, both of which are herein incorporated by reference in their entireties.

TECHNICAL FIELD

The instant disclosure relates to sputter or particle traps for use on sputtering chamber components and methods of making the same. More particularly, the instant disclosure relates to a sputter trap having a multimodal particle distribution.

BACKGROUND

Physical vapor deposition ("PVD") methods can used to form a film or layer of material on a substrate surface. PVD methods can be used in, for example, semiconductor fabrication processes to form metallized layers in the fabrication of integrated circuitry structures and devices. Sputter deposition is a PVD method in which a glow plasma discharge bombards a sputtering target which releases atoms that are subsequently deposited onto a substrate.

A diagrammatic view of a portion of an exemplary sputter deposition apparatus 8 is shown in FIG. 1. In one configuration, a sputtering target assembly 10 comprises a backing plate 12 having a target 14 bonded thereto. A substrate 18 such as a semiconductive material wafer is within the sputter deposition apparatus 8 and provided to be spaced from the target 14. As shown, the target 14 is disposed above the substrate 18 and is positioned such that a sputtering surface 16 faces substrate 18.

In operation, sputtered material 22 is displaced from the surface 16 of target 14 and forms a thin film 20 on substrate 18. In some embodiments, suitable substrates 18 include wafers used in semiconductor fabrication. For example, the target 14 is bombarded with energy until atoms from the surface 16 are released into the surrounding atmosphere and subsequently deposited on substrate 18. In some embodiments, plasma sputtering is used to deposit a thin metal film onto chips or wafers for use in electronics.

Problems can occur in the deposition process if particles are formed, as these particles may fall into or onto a deposited film and disrupt desired properties of the thin film. A sputter or particle trap can be included on a sputtering target to capture particles formed during a deposition process. Additionally, there remains a risk that captured particles may flake off of the sputtering target and disrupt the thin film. For example, loosely held particles may flake from a sputter trap during cyclic thermal stress. Accordingly, it is desired to develop a sputter or particle trap that can be applied to a sputtering component, such as a sputtering target, which captures and retains particles formed during a deposition process. Capture and retention of such particles reduces the probability that a particles falls onto the deposited film during the deposition process.

SUMMARY

In some embodiments, a sputtering target assembly includes a front surface, a back surface opposite the front surface, a sputtering surface on at least a portion of the front surface, a flange extending radially from the sputtering surface, and a sputter trap formed on at least a portion of a front surface of the flange. The sputtering trap includes a plurality of particles and has a particle size distribution plot with at least two different distributions.

In some embodiments, a method of forming a sputter trap on a sputtering target assembly includes adhering particles to at least a portion the sputtering target assembly by a cold spray technique or a thermal spray technique. The particle size distribution plot of the particles adhered has at least two different distributions.

In some embodiments, a sputter trap is formed on at least a portion of a sputtering chamber component. The sputter trap includes a plurality of particles having a particle size distribution plot with at least two different distributions.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

The instant disclosure relates to a sputter or particle trap for use on a PVD apparatus component and methods of making the same. In some embodiments, the PVD apparatus component is a sputtering target for use in a PVD sputtering chamber. However, one skilled in the art will recognize that the sputter trap may be formed on any component of a physical vapor deposition apparatus in which particles are a concern.

Figure 1:
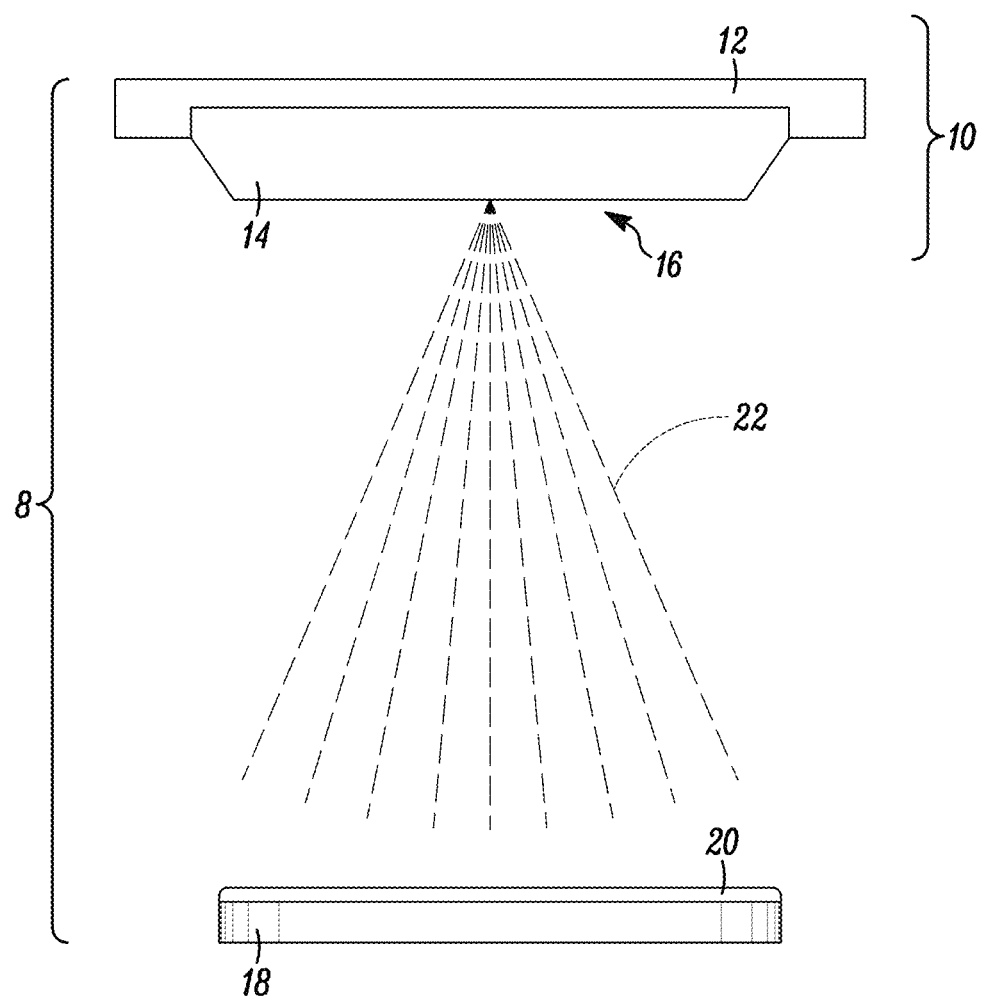
FIG. 1 is a schematic view of a portion of a physical vapor deposition apparatus.
Figure 2:
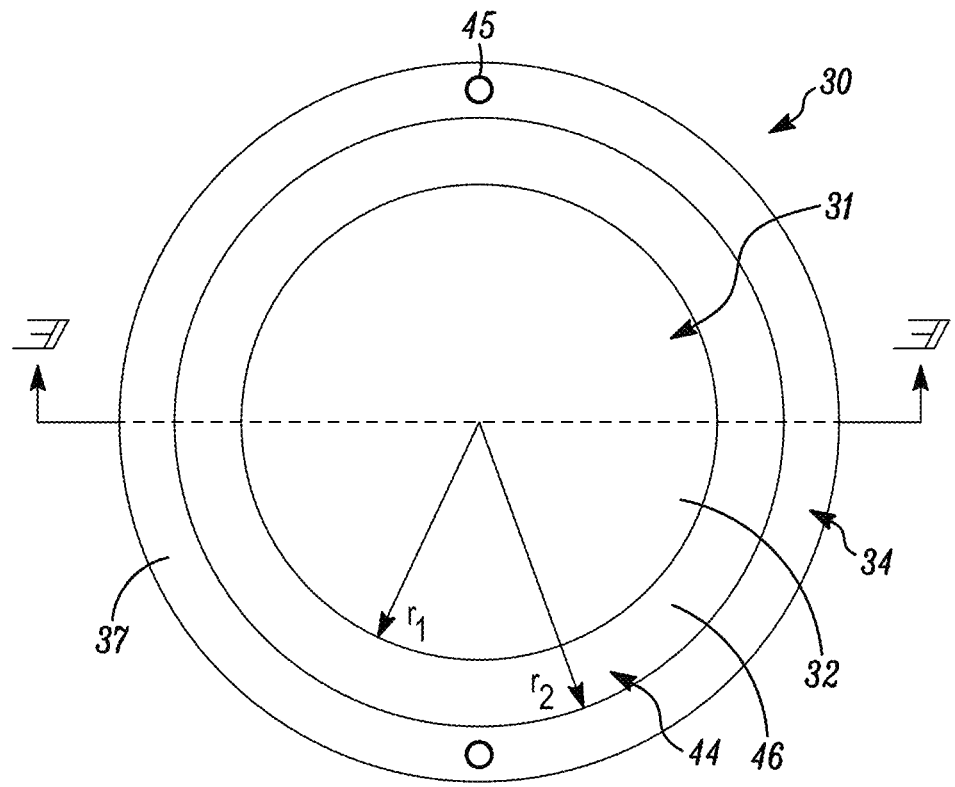
FIG. 2 is a schematic, top view of an exemplary sputtering target assembly.
Figure 3:
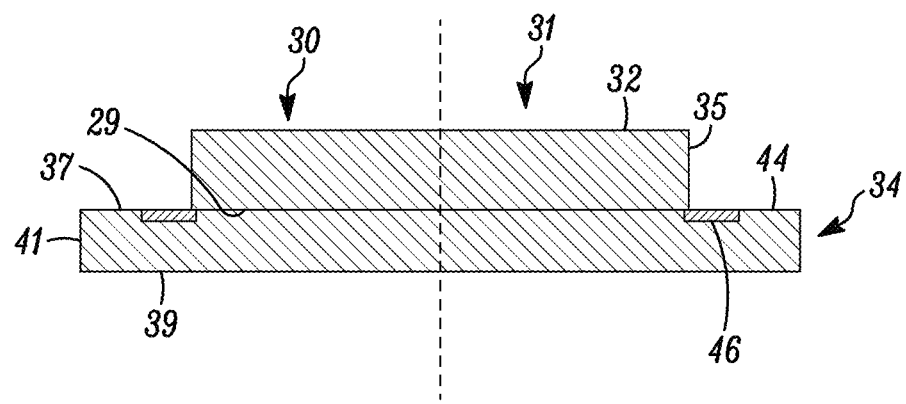
FIG. 3 is a schematic, cross-sectional view along the line 3-3 of FIG. 2.

FIG. 2 is a top view of a sputtering target assembly 30 and FIG. 3 is a cross-sectional view of sputtering target assembly 30 taken along line 3-3 of FIG. 2. Sputtering target assembly 30 includes a sputtering target 31 and a backing plate 34. In some embodiments, sputtering target 31 and backing plate 34 having circular or substantially circular cross-sectional shape in the top view. In use, backing plate 34 is connected to the sputter deposition apparatus, for example, by bolts or clamps.

Sputtering target 31 has a front or sputtering surface 32, a back surface 29 opposite the sputtering surface 32, and a sidewall 35 extending between the sputtering surface 32 and the back surface about the circumference of sputtering target 31. In some embodiments, the sputtering surface 32 may be generally flat or planar. For example, the sputtering surface 32 may be parallel to a horizontal first plane. In other embodiments, the sputtering surface 32 may have one or more convex or concave portions or features. Additionally or alternatively, the back surface of the sputtering target 31 may be substantially planar. Alternatively, the back surface may have protrusions or indentations. For example, the back surface may receive or be received within a portion of backing plate 34, a design which is known as an embedded backing plate.

Sputtering target 31 may be formed from any metal suitable for PVD deposition processes. For example, sputtering target 31 may include aluminum (Al), vanadium (V), niobium (Nb), copper (Cu), titanium (Ti), tantalum (Ta), tungsten (W), ruthenium (Ru), germanium (Ge), selenium (Se), zirconium (Zr), molybdenum (Mo), hafnium (Hf), and alloys thereof such as an Al alloy, a V alloy, a Nb alloy, a Cu alloy, a Ti alloy, a Ta alloy, a W alloy, a Ru alloy, a Ge alloy, a Se alloy, a Zr alloy, a Mo alloy, and a Hf alloy. Suitable alloys include but are not limited to copper-manganese (CuMn) alloys, aluminum-copper (AlCu) alloys, titanium-tungsten (TiW) alloys, tantalum-aluminum (TaAl) alloys, and ruthenium (Ru) alloys.

Backing plate 34 has front surface 37, back surface 39 opposite front surface 37, and sidewall 41 extending from front surface 37 to back surface 39 about the outer circumference of backing plate 34. The back surface of sputtering target 31 is adjacent and bonded to front surface 37 of backing plate 34. The radius of backing plate 34 is larger than that of sputtering target 31 such that at least a portion of the backing plate 34, referred to as flange 44, extends radially outward from the outer diameter or radial edge of the sputtering target 31. In some embodiments, backing plate 34 may be formed from the same material as the sputtering target 31. For example, backing plate 34 and sputtering target 31 may be part of an integral or monolithic sputtering target assembly 30. In other embodiments, backing plate 34 and sputtering target 31 may be separate pieces which are bonded together. In such embodiments, the backing plate 34 may be formed of the same or different material than the sputtering target 31.

Flange 44, which extends radially outward from sputtering target 31, may be substantially flat or planar. In some embodiments, the exposed portion of front surface 37 may be parallel or substantially parallel to the horizontal plane. In other embodiments, the exposed portion of front surface 37 may be in a plane at an angle to the first plane. Flange 44 can include one or more counter bore holes or/and through-holes 45 for connecting or bolting backing plate 34 to the sputter deposition source or apparatus.

Backing plate 34 may be formed from any suitable metal. For example, backing plate 34 may include aluminum (Al), vanadium (V), niobium (Nb), copper (Cu), titanium (Ti), tantalum (Ta), tungsten (W), ruthenium (Ru), germanium (Ge), selenium (Se), zirconium (Zr), molybdenum (Mo), hafnium (Hf), and alloys and combinations thereof. For example, alloys include an Al alloy, a V alloy, a Nb alloy, a Cu alloy, a Ti alloy, a Ta alloy, a W alloy, a Ru alloy, a Ge alloy, a Se alloy, a Zr alloy, a Mo alloy, and a Hf alloy. Suitable alloys include but are not limited to copper-manganese (CuMn) alloys, aluminum-copper (AlCu) alloys, titanium-tungsten (TiW) alloys, tantalum-aluminum (TaAl) alloys, and ruthenium (Ru) alloys. In some embodiments, backing plate 34 and sputtering target 31 may be formed of the same material. In other embodiments, backing plate 34 and sputtering target 31 may be formed of different materials.

Backing plate 34 also includes sputter trap 46 formed on the front surface 37 of flange 44. In some embodiments, the sputter trap 46 can extend from where the sidewall of sputtering target 31 meets front surface 37 of backing plate 34. For example, the sputter trap 46 can extend radially about the circumference of sputtering target 31. In some embodiments, the back surface of target 31 can have an outer radius of r1 and sputter trap 46 can have an inner radius r1 and an outer radius r2. For example, sputter trap 46 can be formed immediately adjacent where target 31 joins to backing plate 34. Additionally or alternatively, the sputter trap may be formed on the sidewall 35 of sputtering target 31.

As discussed herein, particle formation during the sputtering process is a concern because such particles, if deposited on the substrate, will affect the uniformity of the film formed. Even if a particle is trapped or captured in a sputter trap, there is a potential that the particle may flake off during a sputtering deposition. Sputter trap 46 is configured to capture and prevent deposition particles formed during a sputtering deposition process onto the film formed. Additionally, sputter trap 46 is configured to retain the trapped particles. As described herein, sputter trap 46 can be formed by spraying and adhering particles onto backing plate 34 and/or along the circumference of sputtering target 31. Suitable particles for forming sputter trap 46 include metals and metal alloys, ceramics, carbides, and metalloids. Suitable metal and metal alloy particles include titanium and titanium alloys.

For example, particles can be adhered to flange 44 to form sputter trap 46 by a thermal or cold spray process. Such process may form particles from a wire or powder source. For example, particles may be formed from a wire source by a twin wire arc spray process or may be formed from a powder using a plasma spray or cold spray process. The particles formed on the flange 44 have a particle size distribution. A particle distribution plot is formed by plotting particle size against the frequency (i.e., percent of particles). In a powder having a symmetric distribution, the particle distribution plot has a single distribution in the shape of a downward open parabola. The particle distribution plot has a single vertex or peak which is equal to the mean particle size. For a symmetric distribution, the mean, median and mode are equal. The width or breadth of the distribution can be described by the standard deviation or the coefficient of variation of the particles.

The particle size of spherical particles can be described by a diameter. Non-spherical particles are typically described by an equivalent spherical diameter. An equivalent spherical diameter is determined by measuring a physical characteristic, such as scattered light, and determining the size of sphere that would produce the measurement.

Figure 4:
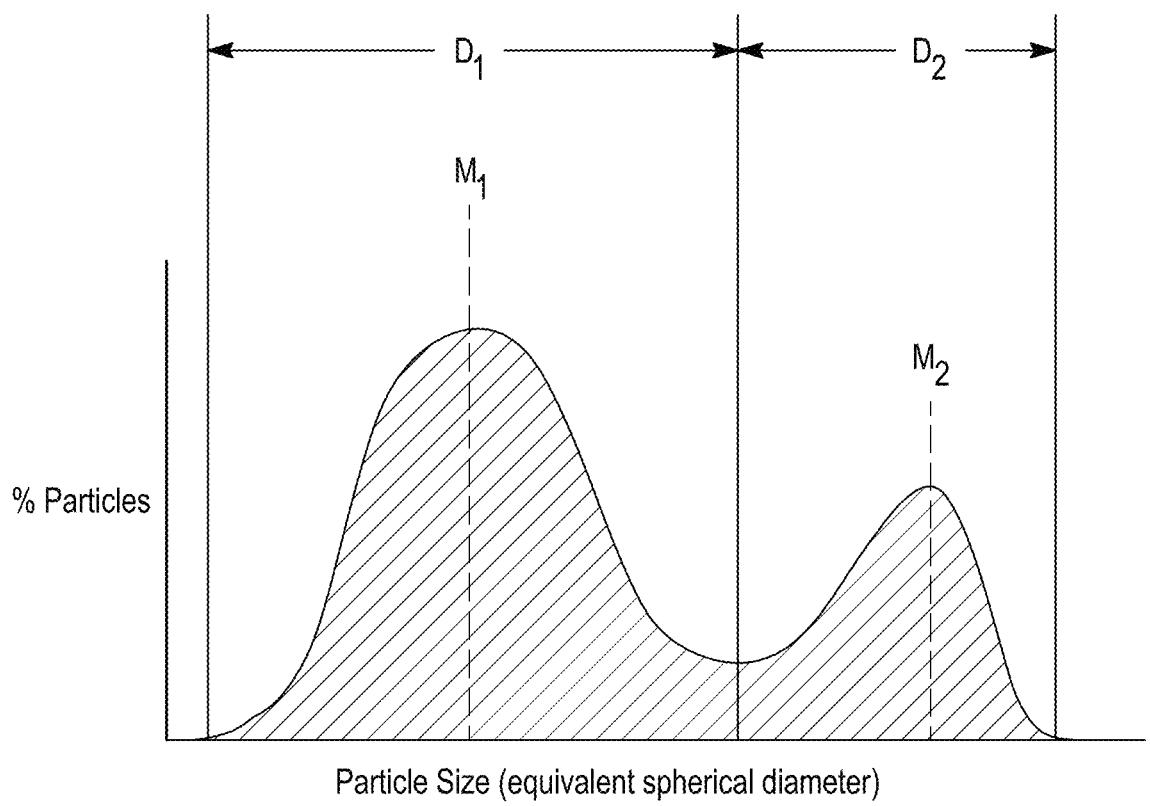
FIG. 4 is an illustrative particle size distribution plot of a sputter trap having a bimodal particle size distribution.

The particle size of the particles of sputter trap 46 can be determined using, for example, a scanning electron microscope (SEM), laser diffraction particle analyzer, or energy dispersive X-ray spectropcopy (EDS). Sputter trap 46 has a particle distribution plot having at least two distinct normal distributions, and each distribution has a mean. For example, the particle distribution plot for the particles of sputter trap 46 may resemble two partially overlapping parabolas. An illustrative plot is shown in FIG. 4, which has a first mean $M_1$ of a first distribution D1 and a second mean $M_2$ of a second distribution $D_2$. In some embodiments, the particle size distribution plot is from a representative sample area of the sputter trap 46. For example, the particle size distribution plot may be created from four equally sized samples taken at four locations equally spaced about sputter trap 46.

The mean surface roughness (Ra) of sputter trap 46 may be at least 5 μm (200 microinches), at least 10 μm (400 microinches), at least 25 μm (1000 microinches), or greater than or equal to 38 μm (1500 microinches). In some embodiments, the Ra of sputter trap 46 may be about 15 μm (600 microinches) to about 50 μm (2000 microinches). The surface roughness may be determined using a surface roughness tester. Suitable surface roughness testers include the Surftest SJ-410 series and the Surftest SJ-201P series, which are both available from Mitutoyo of Aurora, Ill.

Sputter trap 46 may be formed by adhering particles, such as powder particles, to the textured surface. In some embodiments, a texture may be formed on sputter trap 46 before adhesion of the particles. For example, the textured surface may be formed by a saw, knurling device, computer numerically controlled (CNC) device, manual lathe or other suitable machining tool to form a random or repeating pattern. In some embodiments, a saw can be used to cut into a surface and leave the pattern. Alternatively or additionally, a knurling device can be used to press into the surface of the material and leave the desired pattern.

In some embodiments, the textured surface may have a height difference as measured from a maximum height to a minimum height from about 14 μm (550 microinches) to about 30 μm (1150 microinches), from about 19 μm (750 microinches) to about 29 μm (1125 microinches), or from about 23 μm (900 microinches) to about 28 μm (1100 microinches). For example, the textured surface may have height differential from about 13 μm (500 microinches) to about 18 μm (700 microinches), from about 13.5 μm (525 microinches) to about 17 μm (675 microinches), or from about 14 μm (550 microinches) to about 16.5 μm (650 microinches). In other embodiments, the textured surface may have a height differential from about 24 μm (950 microinches) to about 29 μm (1150 microinches), from about 25 μm (975 microinches) to about 28.5 μm (1125 microinches), or from about 25.5 μm (1000 microinches) to about 28 μm (1100 microinches).

The textured surface may additionally or alternatively be formed by bead blasting. When bead blasting is used, abrasive particles may be sprayed onto the surface, such as along the front surface of backing plate 34 and/or along the circumference of sputtering target 31. Suitable abrasive particles for texturing sputter trap 46 include metals powders, ceramics, carbides, hardened alloys, glass bead, aluminum oxides, zirconia aluminum oxide, silicon carbide, steel grit, steel shot, and ceramic beads. In general, the particles of the bead blasting technique impact the surface creating a texture and are removed from the surface. The particles do not bond or adhere to the surface. Similarly, a knurling process presses a pattern into the surface to create a texture, and machining cuts a pattern (i.e., removes material) into the surface to create a texture. Knurling and machining are not intended to bond or adhere particles to the surface of sputter trap 46.

Sputter trap 46 may also be subjected to grit blasting prior to adhering particles to the surface of sputter trap 46. For example, sputter trap 46 having a textured surface may then be subjected grit blasting followed by adhesion of particles to the surface of sputter trap 46. Suitable media for grit blasting include, for example, metals powders, ceramics, carbides, hardened alloys, glass bead, aluminum oxides, zirconia, aluminum oxide, silicon carbide, steel grit, steel shot, and ceramic beads. In some embodiments, the sputter trap 46 may be grit blasted to an Ra of about 2.5 μm (100 microinches) to about 15 μm (600 microinches). In some embodiments, the grit blasting process may increase adhesion of the particles applied in a subsequent process.

Sputter trap 46 is formed by adhering or coating particles, such as powder particles or particles from a wire, onto the surface. As discussed herein, the sputter trap 46 may be textured and/or subjected to grit blasting prior to adhering or coating particles to the surface of sputter trap 46. In some embodiments, sputter trap 46 may be subjected to a thermal spray technique, such as plasma spray, high velocity oxygen fuel (HVOF) coating. Additional suitable methods for adhering particles to sputter trap 46 include a flame spray coating technique or twin wire arc spray coating technique using wire. In some embodiments, sputter trap 46 may be formed on the target assembly or backing plate by a cold spray technique in which the coating material, such as powder particles, are accelerated to high velocities by a supersonic compressed gas at temperature below the melting point of the coating material. The resulting coating is sputter trap 46 which is formed by the accumulation of numerous sprayed particles.

The powder particles used to form sputter trap 46 have a particle distribution plot having at least two peaks. For example, the powder mixture fed to the cold spray apparatus may be formed by mixing two powder compositions having different mesh sizes. Mesh size is the mesh number (a U.S. measurement standard) and its relationship to the size of the openings in the mesh and thus the size of the particles that can pass through these openings. For example, a first powder having a mesh size of 20 μm (635 mesh), 25 μm (500 mesh), 37 μm (400 mesh) or 44 μm (325 mesh) may be combined with a second powder having a mesh size of 210 μm (70 mesh), 74 μm (200 mesh), 88 μm (170 mesh) or 105 μm (140 mesh) to form a powder mixture which applied to the sputtering target assembly by a cold spray technique, in which the mesh size of the first powder is larger (corresponding to a smaller opening size) than the mesh size of the second powder (corresponding to a larger opening size) and the mesh sizes of the first and second powders are different. The powders may be combined in equal amounts by volume. Alternatively, the powder mixture may contain a greater amount by volume of the larger mesh size powder or a greater amount by volume of the smaller mesh size powder. For example, the powder mixture may be formed by mixing 45% by volume of the first powder and 55% by volume of the second powder. The mesh size and volume of each powder may be selected to achieve a desired surface roughness of the sputter trap. Suitable mesh sizes and volume content of a first powder and second powder for the powder mixture are provided in Table 1.

TABLE 1

| | First Powder | | Second Powder | |
|---|---|---|---|---|
| | Suitable mesh size | Suitable volume | Suitable mesh size | Suitable volume |
| Example 1 | 325 to 635 | 95% to 15% | 70 to 270 | 5% to 85% |
| Example 2 | 325, 400, 500, 635 | 95% to 15% | 70, 200, 170, 140, 120, 100, 80, 230, 270 | 5% to 85% |

The powders may be of the same material or different materials. For example, the first and second powders may be titanium powders. It is also contemplated that the powder mixture is formed by combining three or more powders corresponding to different mesh sizes in equal or non-equal amounts by volume. In some embodiments, the powders may be the same type of material as sputtering target 31. For example, the powders and the sputtering target 31 may be nickel alloy materials.

Alternatively, the particles may be applied to the backing plate with a thermal spray coating techniques such as ultra high velocity (UHV), high velocity oxygen fuel (HVOF), plasma flame spray, twin wire arc, fusion bonded and wire metallizing. In a thermal spraying technique, the coating material is melted or heated and sprayed onto the surface. The coating material may be fed to the thermal spray device in a powder or wire form. The thermal spray device heats the coating material to a molten or semi-molten state and accelerates the material towards the flange in the form of micrometer-size particles. The resulting coating is sputter trap 46 which is formed by the accumulation of numerous sprayed particles, such as powder particles or melt materials.

In one embodiment, a sputter trap is formed by plasma spraying a powder mixture containing 44 μm (325 mesh) and 210 μm (70 mesh) titanium powder onto a flange of a sputtering target assembly. In some embodiments, the mixture may include about 50 vol % to about 45 vol % of 44 μm (325 mesh) titanium powder and about 50 vol % to about 55 vol % of the 210 μm (70 mesh) titanium powder.

When the coating material of the thermal spray coating process is a powder, the coating material may be formed by mixing two or more powder compositions having different mesh sizes as described herein with respect to cold spray techniques. When the coating material of the thermal spray coating process is a wire form, the thermal spray coating process is designed or controlled such that the material sprayed from the thermal spray device has particle size distribution having at least two peaks.

A sputter trap formed with one powder will have a particle distribution plot having a single peak (i.e., a mono-modal particle size distribution). The sputter trap disclosed herein is formed with a mixture of two or more powders having different mesh sizes and has a particle distribution plot having two or more different or independent distributions as illustrated by the particle distribution plot having two or more peaks (i.e., multi-modal particle size distribution). For example, a sputter trap formed with a mixture of two powders having different mesh sizes has a particle distribution plot having two separate distributions and having two peaks, and a sputter trap formed with a mixture of three powders having three different mesh sizes has a particle distribution plot having three distributions and having three peaks.

A sputter trap having a multi-modal particle size distribution as described herein may mitigate the potential flaking of prevalent planarized re-deposited film, which is a more stressed film as compared to a non-planarized re-deposited film per geometric effect or roughness effect, Ra of the sputter trap, along the sputter trap during a PVD sputtering process. The multi-modal particle size distribution forms a cluster type re-deposited film along the sputter trap during a PVD process and help reduce the fallen particles from the cyclic thermal stress. The multi-modal particle size distribution can also mitigate the potential flaking off of loosely held re-deposited particles during cyclic thermal stress. That is, the multi-modal particle size distribution of the sputter trap may result in particle reduction during the sputtering process.

The difference in mesh size of a multi-modal powder may also form a surface having an increased surface roughness as compared to a surface formed of only one of the particle sizes. For example, a sputter trap formed of a mixture of 210 μm (70 mesh) and 44 μm (325 mesh) powders may have a surface roughness greater than a sputter trap formed of 210 μm (70 mesh) powder only or 44 μm (325 mesh) powder only.

Figure 5:
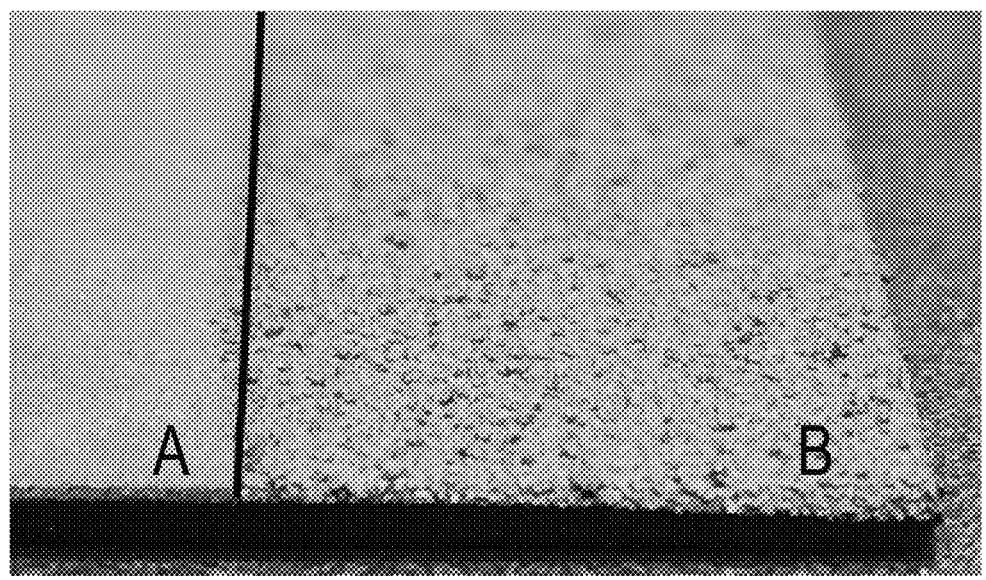
FIG. 5 is an image of a witness sample multimodal sputter trap.

FIG. 5 is an image of a witness sample sputter trap. The witness sample was subjected to grit blasting. Following grit blasting, Side B of the witness sample was subjected to a plasma spray process and bi-modal titanium powder particles were adhered to the surface of the sputter trap. A titanium powder was formed by mixing titanium powders having a first mesh size and a second mesh size and the titanium powder was plasma sprayed onto the sputter trap. Large particle sizes and small particle sizes are seen in FIG. 5. In summary, Side A of the witness sample was subjected to grit blasting. Side B of the witness sample was subjected to the grit blasting following by plasma spray of a bimodal titanium power.

Figure 6:
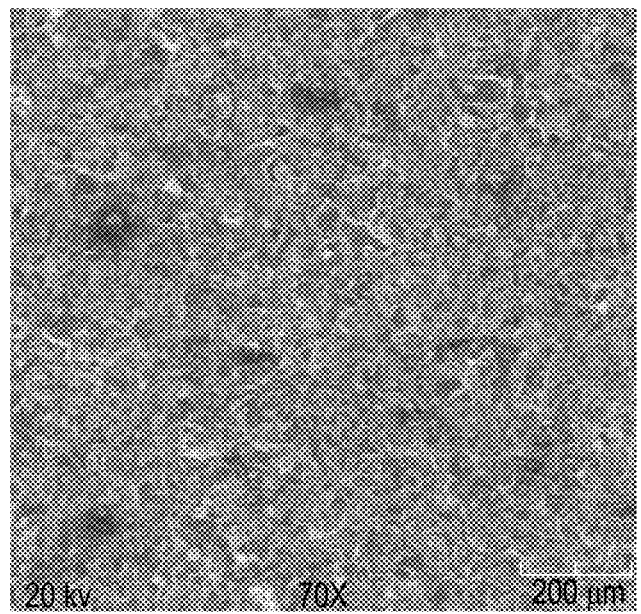
FIG. 6 is a scanning electron microscope micrograph of a sputter trap following bead blasting.
Figure 7:
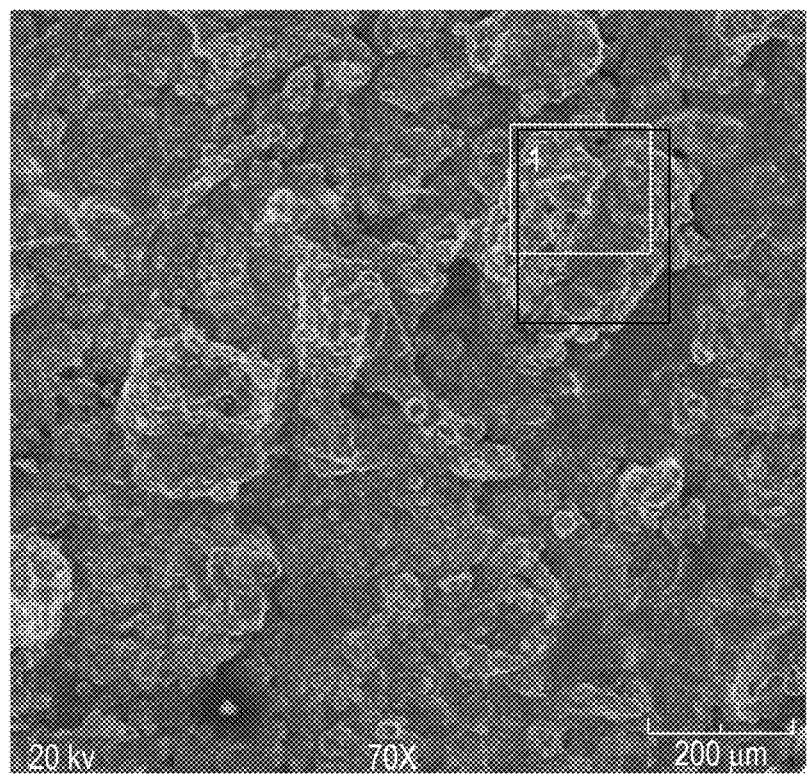
FIG. 7 is a scanning electron microscope micrograph of a multimodal sputter trap.
Figure 8:
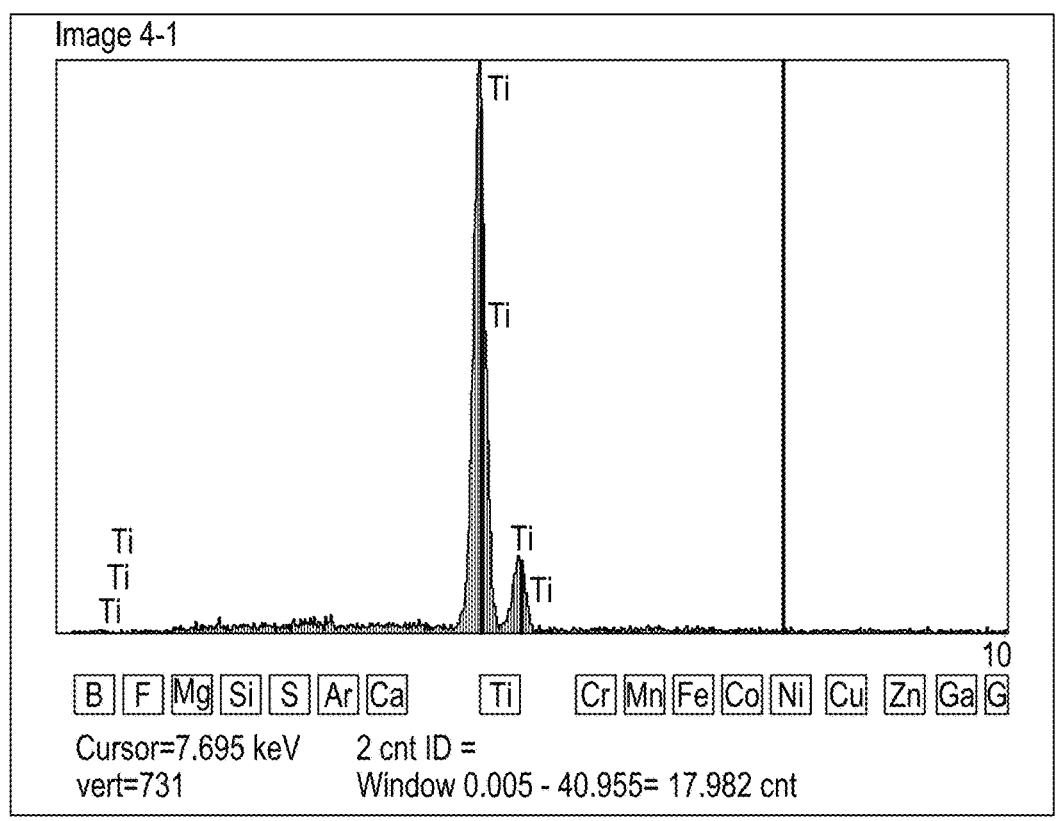
FIG. 8 is an energy dispersive X-ray spectroscopy (EDS) plot for pure titanium powders.

FIG. 6 is a scanning electron microscope (SEM) micrograph of the sputter trap after bead blasting but before adhesion of particles. FIG. 7 is a SEM micrograph of a multimodal sputter trap after a plasma spray process in which a bi-modal titanium powder was adhered to the surface of the sputter trap. The bi-modal titanium powder was formed by mixing titanium powders having a first mesh size and a second mesh size. FIG. 8 is a plot depicting the elemental analysis of the high purity bi-modal titanium powder of FIG. 7 using an energy dispersive X-ray spectroscopy (EDS).

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The following is claimed:

1. A sputtering target assembly comprising:
    a front surface;
    a back surface opposite the front surface;
    a sputtering target on at least a portion of the front surface;
    a flange extending radially from the sputtering target; and
    a sputter trap formed on at least a portion of a front surface of the flange, the sputter trap including a plurality of particles and having a particle size distribution plot with at least two distinct normal distributions, the plurality of particles comprising metals and metal alloys,
    wherein the sputtering target assembly is a monolithic sputtering target assembly.

2. The sputtering target assembly of claim 1, wherein the plurality of particles of the sputter trap include titanium particles, titanium alloy particles or combinations thereof.

3. The sputtering target assembly of claim 2, wherein the plurality of particles of the sputter trap consist of titanium particles.

4. The sputtering target assembly of claim 1, wherein the plurality of particles of the sputter trap include nickel alloy particles.

5. The sputtering target assembly of claim 1, wherein the sputter trap has a surface roughness (Ra) of at least 38 μm.

6. The sputtering target assembly of claim 1, wherein the particle size distribution plot has at least three distinct normal distributions.

7. A method of forming a sputter trap on a sputtering target assembly, the method comprising:
    adhering particles to at least a portion the sputtering target assembly by a cold spray technique or a thermal spray technique, wherein the particle size distribution plot of the particles adhered has at least two distinct normal distributions, and the plurality of particles comprise metals and metal alloys, wherein the sputtering target assembly is a monolithic sputtering target assembly.

8. The method of claim 7, and further comprising forming a textured surface on at least a portion of the sputtering target assembly with bead blasting, knurling or machining, and wherein the particles are adhered to at least a portion of the textured surface.

9. The method of claim 7, wherein the particles include titanium particles, titanium alloy particles or combinations thereof.

10. The method of claim 9, wherein the particles consist of titanium particles.

11. The method of claim 7, wherein the particles include nickel alloy particles.

12. The method of claim 7, wherein the method further comprises:
combining a first powder having a first mesh size and a second powder having a second mesh size to form a powder mixture, wherein the first mesh size and the second mesh size are different and wherein the step of adhering the particles to at least a portion of the sputtering target assembly includes providing the powder mixture to an apparatus for the cold spray or thermal spray technique.

13. The method of claim 12, wherein the first mesh size is from 44 (325 mesh) to 20 μm (635 mesh) and the second mesh is from 210 μm (70 mesh) to 53 μm (270 mesh).

14. The method of claim 12, wherein the first powder is present in an amount from about 15% to about 95% by volume of the powder mixture and the second powder is present in an amount from about 5% to about 85% by volume of the powder mixture.

15. The method of claim 7, wherein the method further comprises:
combining a first powder having a first mesh size, a second powder having a second mesh size, and a third powder having a third mesh size to form a powder mixture, wherein the first mesh size, the second mesh size, and the third mesh size are different and wherein the step of adhering the particles to at least a portion of the sputtering target assembly includes providing the powder mixture to an apparatus for the cold spray or thermal spray technique.

16. The method of claim 7, wherein the particles are adhered to at least a portion of the sputtering target assembly by the cold spray technique.

17. The method of claim 7, wherein the particles are adhered to at least a portion of the sputtering target assembly by the thermal spray technique.

18. The method of claim 17, wherein the thermal spray technique is plasma spray.

19. The method of any of claim 7, wherein prior to adhering the particles to the sputtering target assembly, at least a portion of a surface of the sputtering target assembly is subjected to grit blasting and the particles are adhered to at least a portion of the grit blasted surface.

* * * * *